(12) United States Patent
Li et al.

(10) Patent No.: US 6,456,115 B2
(45) Date of Patent: Sep. 24, 2002

(54) CLOCK GATE BUFFERING CIRCUIT

(75) Inventors: Guo-Wei Li, Taipei Hsien (TW); Jeng-Huang Wu, Taipei (TW); Chih-Fu Chien, Taipei (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/779,398

(22) Filed: Feb. 8, 2001

(30) Foreign Application Priority Data

Jan. 2, 2001 (TW) .......................................... 90100008

(51) Int. Cl.[7] .......................................... H03K 19/096
(52) U.S. Cl. .............................. 326/95; 326/93; 326/98; 326/113
(58) Field of Search .............................. 326/93, 95, 98, 326/113; 327/34, 166, 291, 299

(56) References Cited

U.S. PATENT DOCUMENTS

| | | | | |
|---|---|---|---|---|
| 5,798,980 A | * | 8/1998 | McClure | ..................... 365/233 |
| 5,811,992 A | * | 9/1998 | D'Souza | ....................... 326/98 |
| 5,883,529 A | * | 3/1999 | Kumata et al. | ................ 326/93 |
| 6,249,149 B1 | * | 6/2001 | Pedersen | ...................... 326/93 |
| 6,275,086 B1 | * | 8/2001 | Douchi | ........................ 327/296 |

OTHER PUBLICATIONS

Rhyne, Fundamentals of Digital Systems Design, N.J., 1973, pp. 70–71.*

* cited by examiner

*Primary Examiner*—Michael G. Lee
*Assistant Examiner*—Steven S. Paik
(74) *Attorney, Agent, or Firm*—J.C. Patents

(57) ABSTRACT

A clock gate buffering circuit is having a functional circuit without a latch that receives a clock and an enable signal. A logic voltage of an enable signal sends a corresponding clock gate signal to provide the other circuit when the clock of the functional circuit is in a rising edge. Also, the logical voltage of the enable signal sends a corresponding clock gate signal to provide the other circuit when this functional circuit is also in falling edge.

24 Claims, 13 Drawing Sheets

CLOCK GATE BUFFERING CIRCUIT

CROSS-REFERENCE TO RELATED APPLICATION

This application claims the priority benefit of Taiwan application Ser. No. 90100008, filed Jan. 2, 2001.

BACKGROUND OF THE INVENTION

1. Field of Invention

The present invention relates to an electronic circuit device. More particularly, the present invention relates to a clock gate buffering circuit that includes a functional circuit without a latch, that receives a clock signal and an enable signal, and outputs a clock gate signal.

2. Description of Related Art

Clock gate device is an important device and is often used in a digital circuit, especially the low voltage circuits, for example. A conventional clock gate device has many disadvantages, such as an output of an enable signal is unstable when a glitch occurs, and a time skew further occurs.

FIG. 1 illustrates a conventional circuit of the clock gate. The circuit includes a AND gate that receives a clock signal CK and an enable signal E, and sends a clock gate signal GCK. A performance logic table is shown below:

| Enable Signal, E | Clock, CK | Clock Gate Signal, GCK |
|---|---|---|
| 0 | X | 0 |
| 1 | 0 | 0 |
| 1 | 1 | 1 | wherein X represents at any state signal. There are some disadvantages in the circuit of the clock gate in FIG. 1. The major disadvantage is a signal glitch of the enable signal that makes a noise when the clock signal CK is 1. The noise will send to the clock gate signal and effect the state of flip-flop (FF) device in next level and make an error.

Another conventional circuit has been developed to solve the problem of the signal glitch. FIG. 2 illustrates another conventional circuit of the clock gate. In FIG. 2, the circuit further includes a latch to control the clock signal. The performance logic table is shown below:

| Clock, CK | Enable Signal, E | Clock Gate Signal, GCK |
|---|---|---|
| Rising Edge | 0 | 0 |
| Rising Edge | 1 | 1 |
| Falling Edge | X | 0 |

The circuit of the clock gate circuit is normally designed for a dynamic clock gate signal in FIG. 2. According to this design, the glitch signal of the enable signal cannot send a signal to the functional circuit element in next level. However, a latch is the major disadvantage in the circuit. The setup time and the transition time between the enable signal and the clock signal need to calculate. The clock skew is very easy occurred.

SUMMARY OF THE INVENTION

The invention provides a clock gate circuit. As embodied and broadly described herein, the invention provides a functional circuit without a latch. More particularly, the functional circuit of this invention receives a clock signal and an enable signal. When the clock rate is rising, the functional circuit sends a clock gate signal according to a logical voltage level of the enable signal. And when the clock rate is falling, the functional circuit also sends a clock gate signal.

The circuit of clock gate is a functional circuit without the latch. There are several advantages in this invention, including simplifying the circuit, reducing the size of circuit, reducing the consumption of power, reducing the transition time between the clock signal and the clock gate signal, reducing the clock skew, reducing the setup time between the enable signal and the clock signal, and simplifying the management of the power.

In above describing, a logical state of the clock gate signal and the enable signal is either consistent of or opposite to each other. More particularly, the enable signal is either a logical high or a logical low signal.

The functional circuit includes a first inverter, a first functional gate circuit and a NOR gate. The first inverter receives a clock signal and sends a first signal. The first functional gate circuit receives an enable signal and the first signal, and sends a second signal. The NOR gate receives the second signal and the clock signal and sends a clock gate signal.

Instead, the functional circuit includes a first inverter, a first functional gate circuit and an AND gate. The first inverter receives a clock signal and sends a first signal. The first functional gate circuit receives an enable signal and the first signal, and sends a second signal. The AND gate receives the second signal and the clock signal, and sends a clock gate signal.

In addition, this invention also provides a clock gate buffering circuit, including a functional circuit without a latch. The functional circuit of the clock gate buffering circuit receives a clock signal and an enable signal. When the clock signal is a falling, a logical voltage level of the enable signal sends a clock gate signal. When the clock is a rising, the functional circuit of the invention always sends a clock gate signal of logical high.

In above describing, the functional circuit receives a logical state of the clock gate signal and the enable signal either consistent of or opposite to each other when the clock is falling. More particularly, the enable signal is either a logical high or a logical low signal.

The functional circuit of the invention includes a first functional gate circuit and an OR gate. The first functional gate circuit receives an enable signal and a clock signal, and sends a first signal. The OR gate receives the first signal and the clock signal, and sends a clock gate signal.

Instead, the functional circuit includes a first functional gate circuit, a first inverter and a NAND gate. The first functional gate circuit receives an enable signal and a clock signal, and sends a first signal. The first inverter receives the clock signal and sends a second signal. The NAND gate receives the first and second signals and sends a clock gate signal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The main feature of this invention is the circuit combines a tristate buffer and a logical gate of two inputs to complete the action of the clock gate, and the circuit does not need a latch. There are several advantages in this invention of the circuit, including simplifying the circular structure, reducing the size of circuit, reducing the transition time between the clock signal and the clock gate signal, reducing the clock signal delay, reducing the setup time between the enable signal and the clock signal, and simplifying the management of the power.

Here are some preferred embodiments of this invention, which are illustrated in the accompanying drawings.

Figure 1:
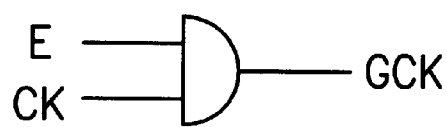
FIG. 1 is a conventional clock gate circuit.
Figure 2:
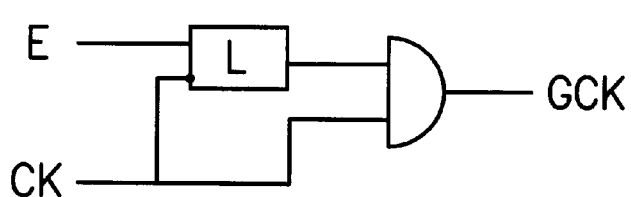
FIG. 2 is another conventional clock gate circuit.
Figure 3:
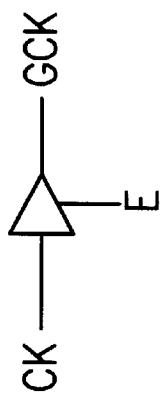
FIG. 3 is one preferred embodiment of this invention, showing the operational function of a first type of the clock gate circuit.
Figure 3:
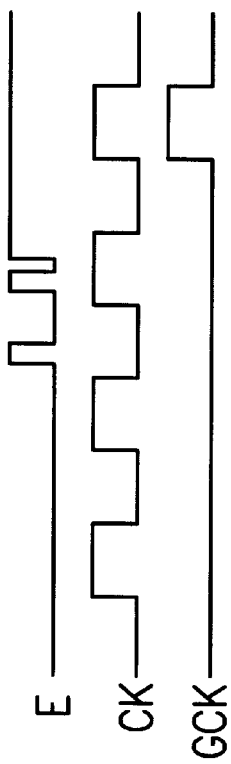

FIG. 3 illustrates the operational function of the first embodiment of the circuit of the clock gate and includes a timing diagram on the left, a clock gate circuit in the middle, and the performance logic table on the right. As shown in the timing diagram, the enable signal cannot avoid encountering glitch noise, because the output signal is depended either rising of or falling of the clock signal CK, and output signal does not affect by the glitch noise. The logic table shows that when the clock signal CK is rising, the enable signal is in a low logic voltage level and the output signal sends a low logic level signal. When the enable signal is in a high logic voltage level, the output signal sends a high logic voltage level signal.

Figure 4:
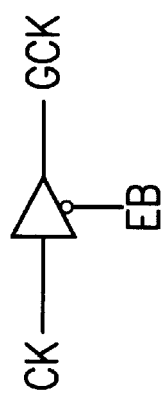
FIG. 4 is a second preferred embodiment of this invention, showing the operational function of a second type of the clock gate circuit.
Figure 4:
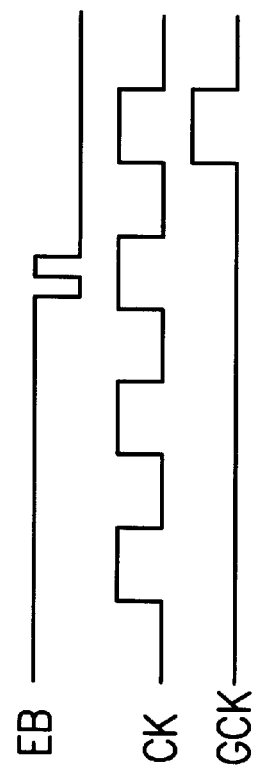

FIG. 4 shows the operational function of the second embodiment of the circuit of the clock gate and includes a timing diagram on the left, a clock gate circuit in the middle, and a performance logic table on the right. As shown in the timing diagram, the enable signal cannot avoid encountering glitch noise, because the output signal is depended either rising of or falling of the clock signal CK, and the output signal does not affect by the glitch noise. The logic table shows that when the clock signal CK is rising, the enable signal is a high logic voltage level, and the output signal sends a low logic voltage level signal. When the enable signal is in a low logical voltage level, the output signal sends a high logical voltage level signal. When the clock signal CK is falling, the output signal sends a stable low logic voltage level signal. The circuit diagram of FIG. 4 is similar to the circuit diagram of FIG. 3, but the enable signal is a complementary signal EB.

Figure 5:
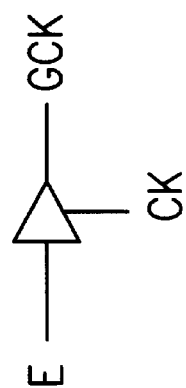
FIG. 5 is a third preferred embodiment of this invention, showing the operational function of a third type of the clock gate circuit.
Figure 5:
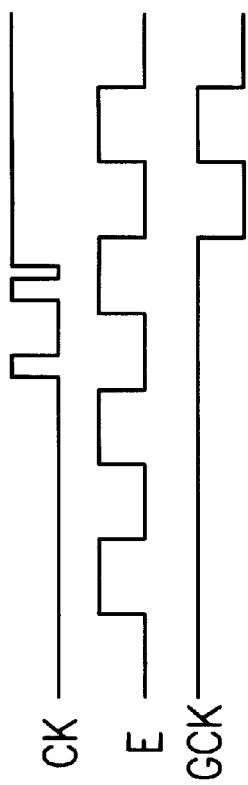

FIG. 5 illustrates the operational function of a third embodiment of the circuit of the clock gate and includes a timing diagram on the left, a clock gate circuit in the middle, and the performance logic table on the right. According to the timing diagram, the enable signal that cannot avoid encountering the glitch noise, but the output signal is depended either rising of or falling of the clock signal CK, and the output signal does not affect by the glitch noise. The logic table shows that when the clock signal CK is falling, the enable signal is a low logic voltage level, and the output signal sends a high logic voltage level signal. When the enable signal is in a high logical voltage level, the output signal sends a low logical voltage level signal. When the clock signal CK is rising, the output signal sends a stable high logic voltage level signal.

Figure 6:
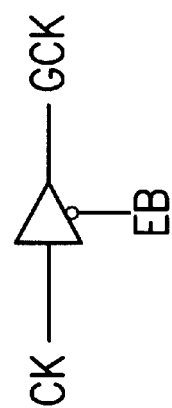
FIG. 6 is a fourth preferred embodiment of this invention, showing the operational function of a fourth type of the clock gate circuit.
Figure 6:
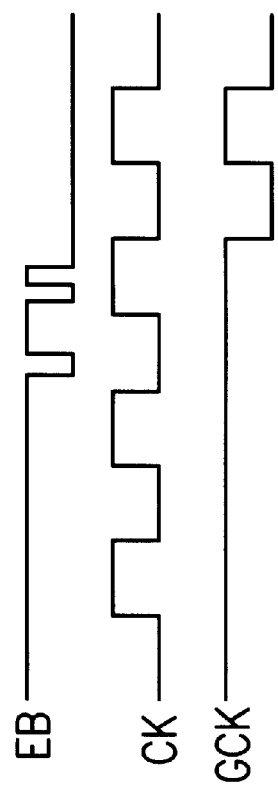

FIG. 6 shows the operational function of a fourth embodiment of the circuit of the clock gate circuit and includes a timing diagram on the left, a clock gate circuit in the middle, and the performance logic table on the right. According to the timing diagram, the enable signal cannot avoid encountering the glitch noise, but the output signal is depended on either rising of or falling of the clock signal CK, and the output signal does not affect by the glitch noise. The logic table shows that when the clock signal CK is falling, the enable signal is a high logic voltage level, and the output signal sends a high logical voltage level signal. When the enable signal is in a low logic voltage level, the output signal also sends a low logic voltage level signal. When the clock signal CK is rising, the output signal sends a stable high logical voltage level. The circuit diagram of FIG. 6 is similar to the circuit diagram of FIG. 5, but the enable signal is a complementary signal EB.

Figure 7A:
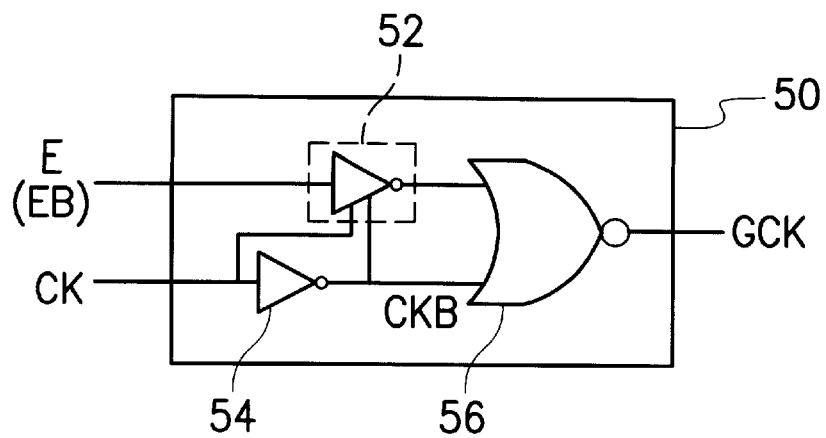
FIG. 7A through FIG. 7C show the functional circuits and some circuit structures of the clock gate circuit according to the first preferred embodiment of this invention.
Figure 7B:
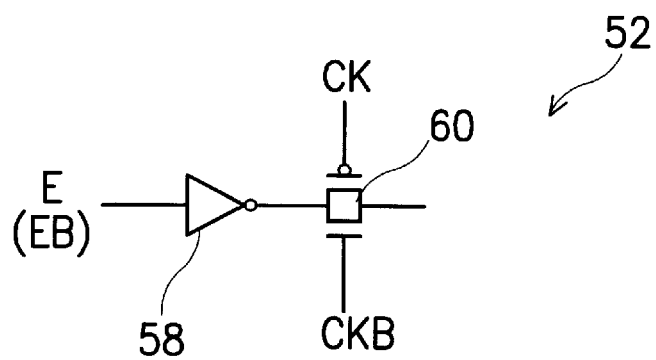
Figure 7C:
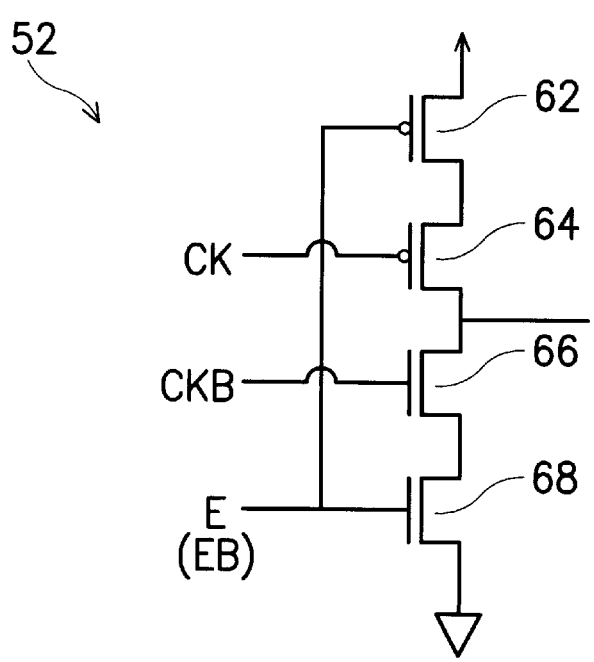

The above description shows the structure of the clock gate circuit and the operational function. Now, there is a more detailed description of the preferred embodiments. FIG. 7A through FIG. 7C illustrate a couple of circuit structures for the first embodiment of the circuit of the clock gate. In FIG. 7A, a clock gate circuit 50 includes an inverter 54, a functional circuit 52 and a NOR gate 56. The inverter 54 receives a clock signal CK. The functional circuit 52 receives an enable signal and a complementary clock signal CKB and the clock signal CK. The NOR gate 56 receives the two output both from the functional circuit 52 and the inverter 54. Then the NOR gate 56 sends the clock gate signal GCK.

FIG. 7B illustrates a practical circuit of the functional circuit 52. The functional circuit 52 includes an inverter 58 and a transitional gate 60. The transitional gate 60 is normally composed of a PMOS transistor and a NMOS transistor. For example, the gate of PMOS transistor connects to the clock signal CK, and the gate of NMOS transistor connects to the complementary clock signal CKB. The transitional gate 60 sends a signal to the NOR gate 56. The enable signal is practically designed and matched with the inverter; therefore, it can receive either a logical low or a logical high.

FIG. 7C shows another practical circuit of the functional circuit 52. The functional circuit 52 includes a first PMOS transistor 62, a second PMOS transistor 64, a first NMOS transistor 66 and a second NMOS transistor 68. All transistors are connected together in a series. Two gates of the first NMOS transistor 62 and the second NMOS transistor 68 are connected together and receive the enable signal E (EB). And two gates of the second PMOS transistor 64 and the first NMOS transistor 66 receive a part of clock signal CK and complementary clock signal CKB. A connecting node between the second PMOS transistor 64 and the first NMOS transistor 66 is an output node and sends a signal to the NOR gate 56. The enable signal is practically designed and matched with the inverter 56; therefore, it can receive either a logical low or a logical high.

Figure 8A:
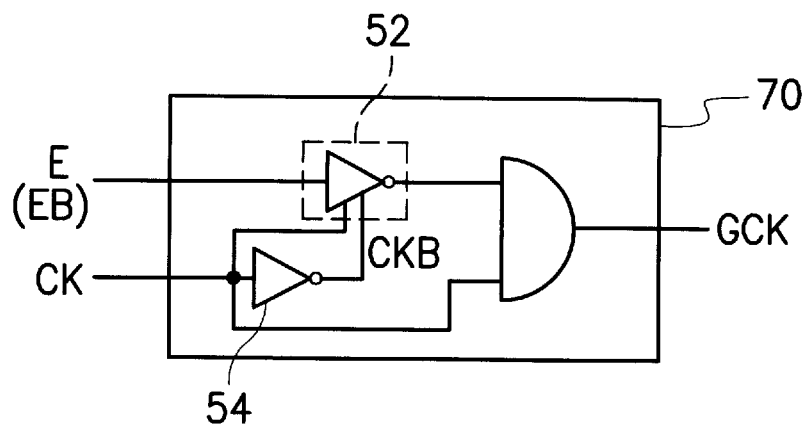
FIG. 8A through FIG. 8C show the function circuits and some circuit structures of the clock gate circuit according to the second preferred embodiment of this invention.
Figure 8B:
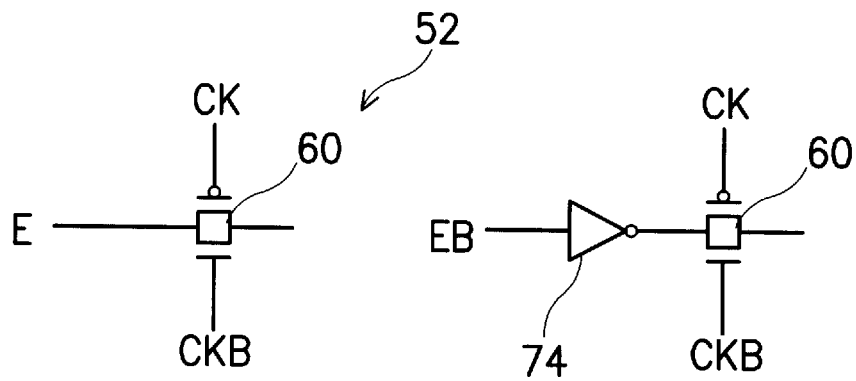
Figure 8C:
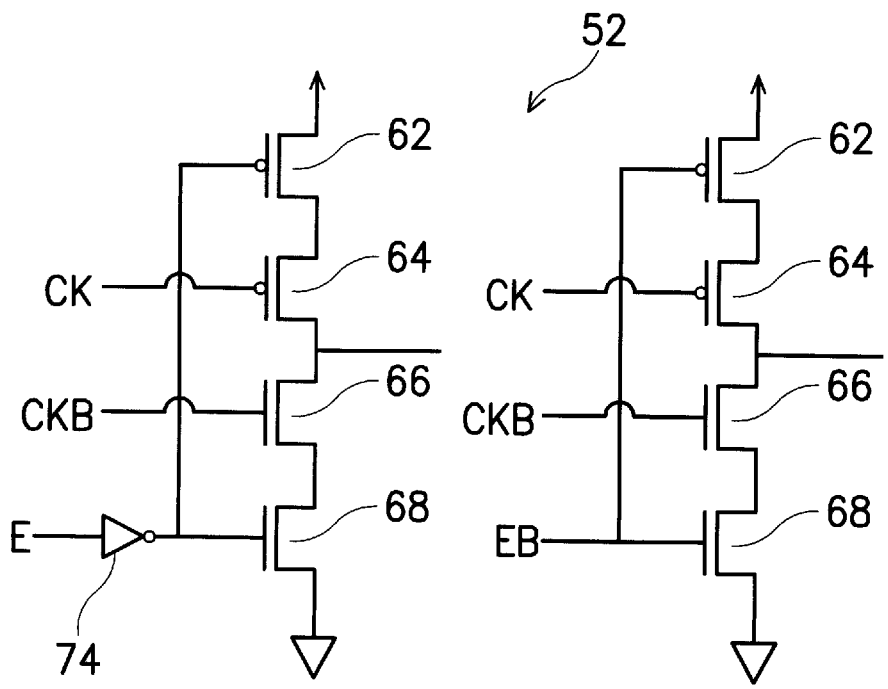

Similarly, FIG. 8A through FIG. 8C illustrate a couple of circuit structures for the second embodiment of the clock gate circuit. In FIG. 8A, a clock gate circuit 70 includes an inverter 54, a functional circuit 52 and an AND gate. The inverter 54 receives a clock signal CK. The functional circuit 52 receives an enable signal, the clock signal CK and a complementary clock signal CKB. The AND gate receives the two output both from the functional circuit 52 and the clock signal CK; then it sends the clock gate signal GCK.

FIG. 8B shows another practical circuit of the functional circuit 52. The functional circuit 52 includes a transitional gate 60 that is composed of a PMOS transistor and a NMOS transistor. For example, the gate of the PMOS transistor is connected to the clock signal CK, and the gate of the NMOS transistor is connected to the complementary clock signal CKB signal. The transitional gate 60 sends a signal to the NOR gate 56. The enable signal is practically designed and matched with the inverter 74; therefore it can receive either a logical low or a logical high.

FIG. 8C shows another practical circuit of the functional circuit 52. The functional circuit 52 includes a first PMOS transistor 62, a second PMOS transistor 64, a first NMOS transistor 66 and a second NMOS transistor 68. All transistors are connected together in a series. Two gates of the first PMOS transistor 62 and the second NMOS transistor 68 receive the enable signal E together, and two gates of the second PMOS transistor 64 and the first NMOS transistor 66 receive respectively both the clock signal CK and the complementary clock signal CKB. A connect node between the second PMOS transistor 64 and the first NMOS transistor 66 is an output node, and it sends a signal to the AND gate. The enable signal is practically designed and matched with the inverter, and it can receive either a logical low or a logical high.

Figure 9A:
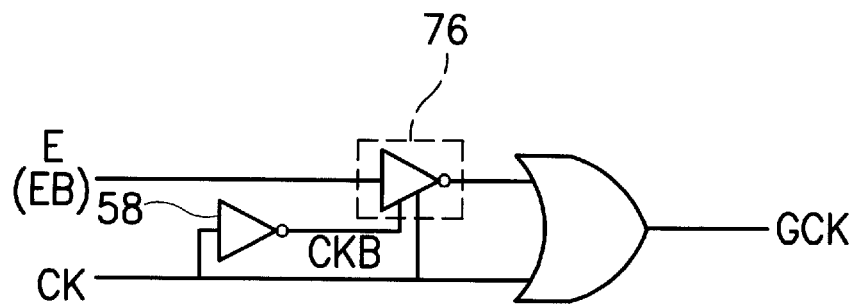
FIG. 9A through FIG. 9C show the functional circuits and some circuit structures of the clock gate circuit according to the third preferred embodiment of this invention.
Figure 9B:
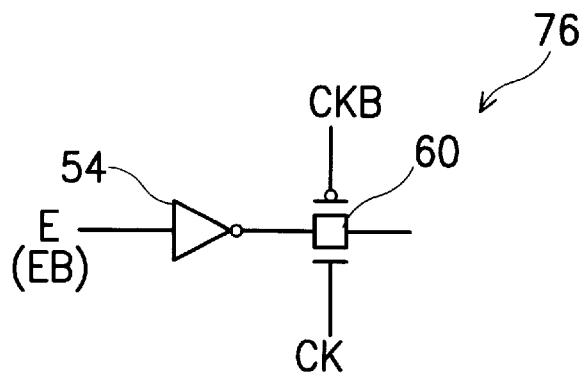
Figure 9C:
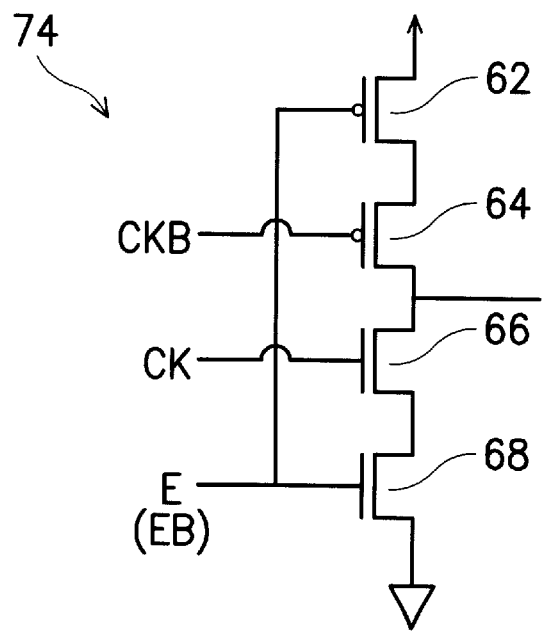

Similarly, FIG. 9A through FIG. 9C illustrate a couple of circuit structures for the third embodiment of the clock gate circuit. In FIG. 9A, a clock gate circuit includes an inverter 54, a functional circuit 76 and an OR gate. The inverter 54 receives a clock signal CK. The functional circuit 76 receives an enable signal, clock signal CK and a complementary clock signal CKB. The OR gate receives the two output signals both from the functional circuit 76 and the clock signal CK, and sends the clock gate signal GCK.

FIG. 9B illustrates another circuit of the functional circuit 76. The functional circuit 76 includes an inverter 74 and a transitional gate 60. The transitional gate 60 is composed of a PMOS transistor and a NMOS transistor. The gate of the PMOS transistor receives the clock signal CK signal. The transitional gate 60 sends a signal to the OR gate. The enable signal is practically designed and matched with the inverter 76, and it can receive either a logical low or a logical high.

FIG. 9C illustrates another circuit of the functional circuit 76 that includes a first PMOS transistor 62, a second transistor 64, a first NMOS transistor 66 and a second NMOS transistor 68. All transistors are connected together in a series. Two gates of the first PMOS transistor 62 and the second NMOS transistor 68 receive the enable signal E (EB) together. Two gates of the second PMOS transistor 64 and the first NMOS transistor 66 receive the clock signal CK and the complementary clock signal CKB. A connecting node between the second PMOS transistor 64 and the first NMOS transistor 66 is an output node and it sends a signal to the OR gate. The enable signal is practically designed and matched with an inverter, and it can receive either a logical low or a logical high.

Figure 10A:
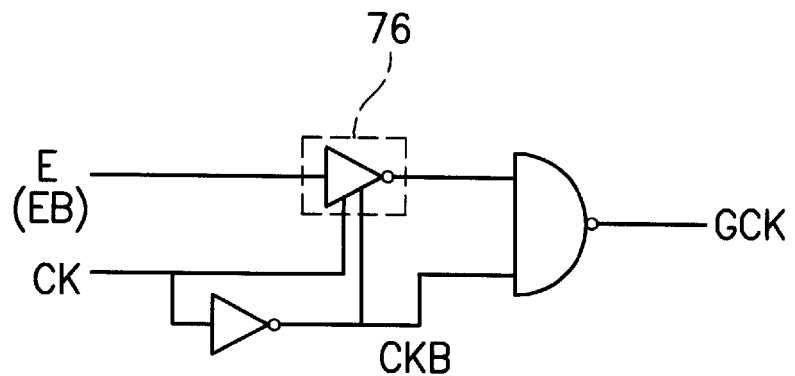
FIG. 10A through FIG. 10C show the functional circuits and some circuit structures of the clock gate circuit according to the fourth preferred embodiment of this invention.
Figure 10B:
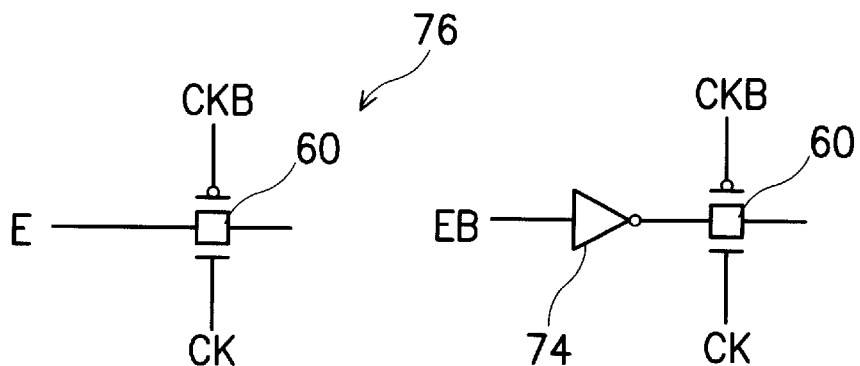
Figure 10C:
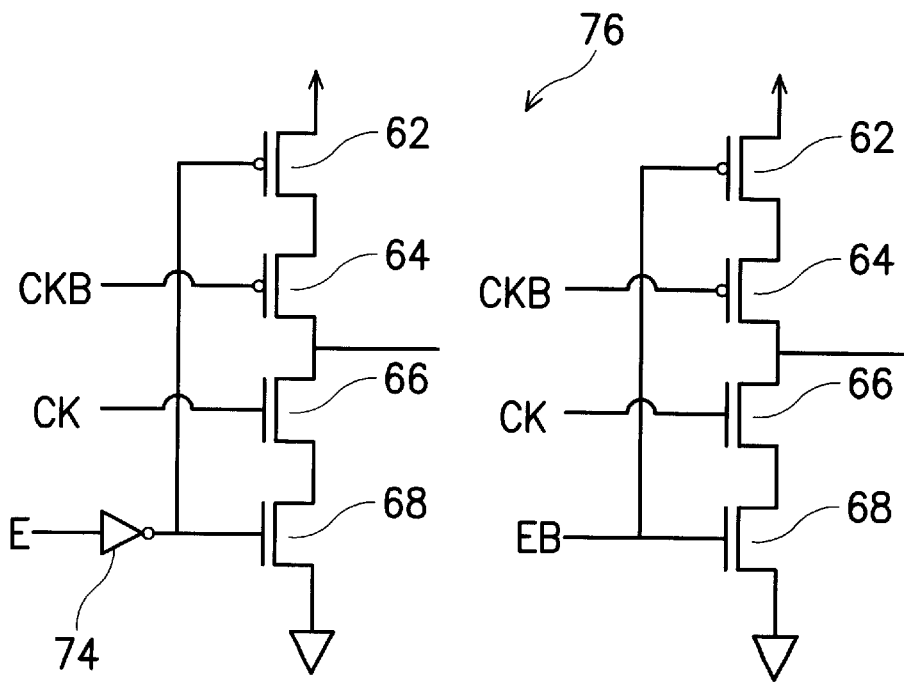

Similarly, FIG. 10A through FIG. 10C illustrates a couple of circuit structures for the fourth embodiment of the clock gate circuit. In FIG. 10A, a clock gate circuit includes an inverter 54, a functional circuit 76 and a NAND gate. The inverter 54 receives a clock signal CK. The functional circuit 76 receives an enable signal E, the clock signal CK and a complementary clock signal CKB. The NAND gate receives the output of the functional circuit 76 and complementary clock signal CKB, and it sends the clock gate signal GCK.

FIG. 10B illustrates the functional circuit 76 that includes a transitional gate 60. The transitional gate 60 is composed of a PMOS transistor and a NMOS transistor, wherein the gate of the PMOS transistor receives the complementary clock signal CKB signal, and the gate of the NMOS transistor receives the clock signal CK. The transitional gate 60 sends a signal to the OR gate. The enable signal is practically designed and matched with the inverter 74, and it can receive either a logical low or a logical high.

From the above description of the embodiments, when the system frequency is too slow or when the input of the clock signal CK experiences a long period of toggle, then the functional circuit of the output node is in a floating state. To avoid the floating state, a feedback functional circuit can be added.

Figure 11:
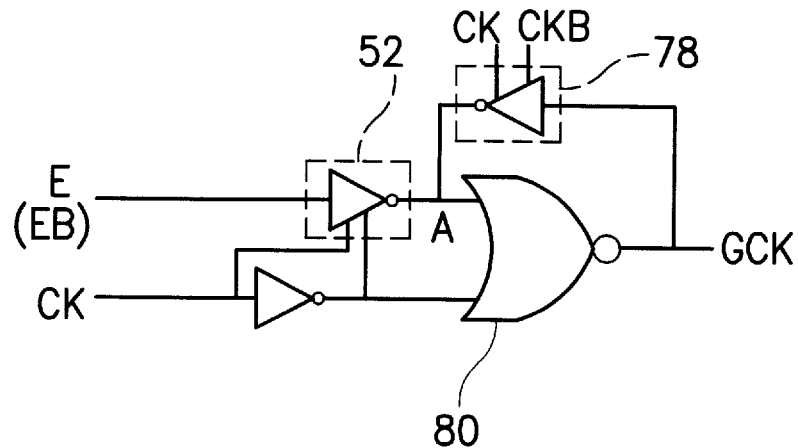
FIG. 11 is the circuit structure of the clock gate circuit of the first preferred embodiment plus a feedback functional circuit.
Figure 12:
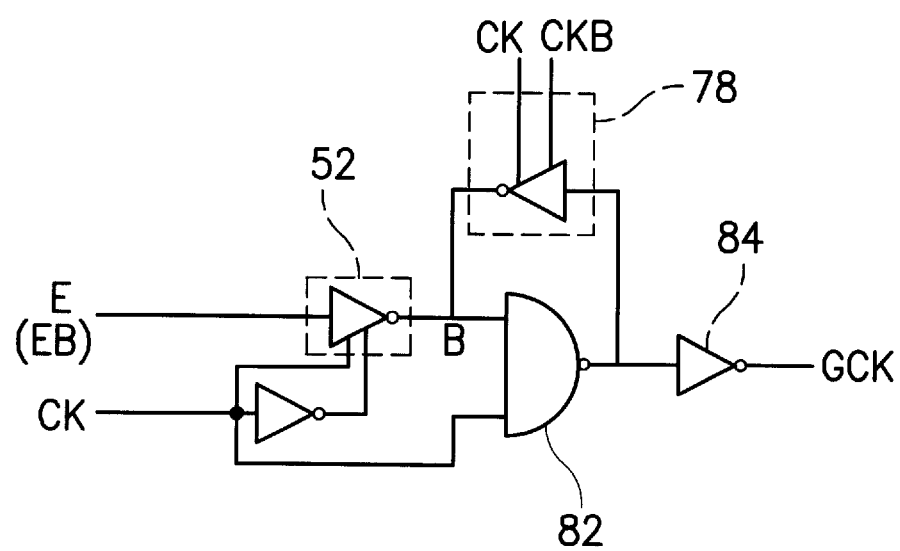
FIG. 12 is the circuit structure of the clock gate circuit of the second preferred embodiment plus a feedback functional circuit.

FIG. 11 illustrates the circuit structure of the first embodiment of the clock gate circuit including a feedback functional circuit. In FIG. 11, the feedback functional circuit 78 is fed back to the clock functional circuit to the node A. FIG. 12 shows the circuit structure of the second embodiment of the clock gate circuit including a feedback functional circuit. In FIG. 12, two inverters are included. One inverter and the AND gate become a NAND gate 82. Another inverter 84 is connected in series on the last part of the circuit. The feedback functional circuit 78 feeds back the complementary clock gate signal to the node B.

Figure 13:
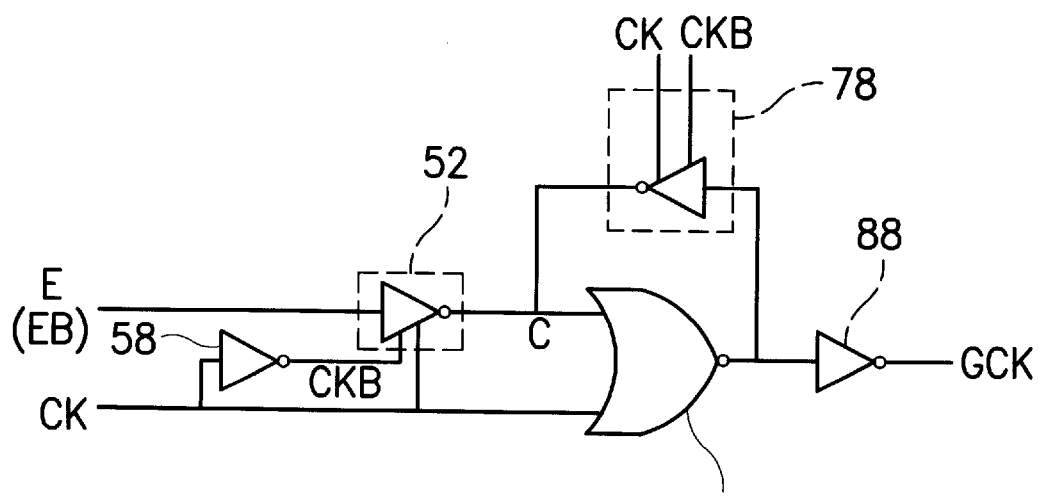
FIG. 13 is the circuit structure of the clock gate circuit of the third preferred embodiment plus a feedback functional circuit.
Figure 14:
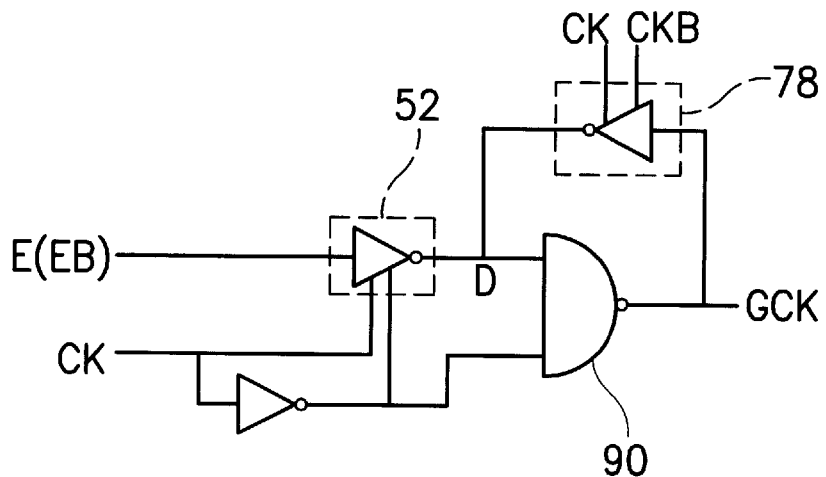
FIG. 14 is the circuit structure of the clock gate circuit of the fourth preferred embodiment plus a feedback functional circuit.

FIG. 13 illustrates the circuit structure of the third embodiment of the clock gate circuit including a feedback functional circuit. FIG. 13 is similar to FIG. 9A because it also includes two inverters. One inverter and the AND gate become a NOR gate 86. Another inverter 88 is connected in series to the last part of the circuit. The feedback functional circuit 78 feeds back the complementary clock gate signal to the node C. FIG. 14 is similar to FIG. 10A because it also includes a feedback circuit functional circuit 78 that feeds back the clock gate signal to the node D.

Figure 15A:
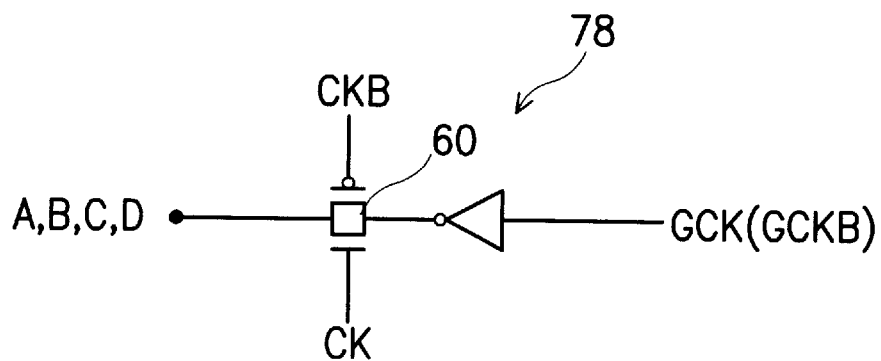
FIG. 15A through FIG. 15B are the circuit structures of some feedback functional circuits according to this invention.
Figure 15B:
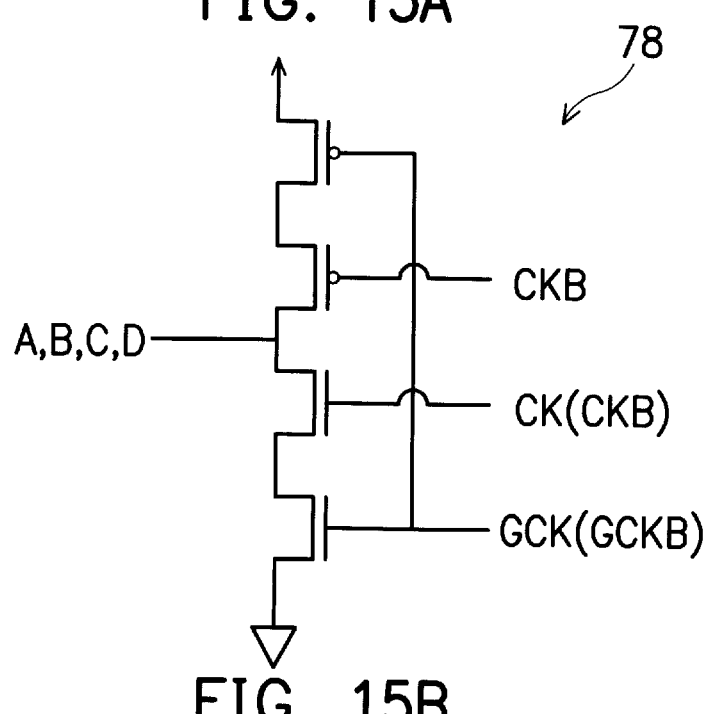

FIG. 15A through FIG. 15B illustrates some other circuit structures of feedback functional circuits. In FIG. 15A, the feedback functional circuit 78 includes a transitional gate and an inverter that both are connected together in series. The inverter receives the clock gate signal GCK, and the transitional gate receives the output of the inverter. Then the signal is fed back to the functional circuit 52 output, and it becomes the node A, B, C, or D. The inverter depends on its design and also receives the complementary clock gate signal GCKB.

In FIG. 15B, the feedback circuit 78 can be designed both the first and the second PMOS transistors and both the first and the second NMOS transistors, and they are connected together in a series. The two gates of the first PMOS transistor and the second NMOS transistor receive the clock gate signal GCK (GCKB) together. A connecting node of the second PMOS transistor and the first NMOS transistor is an output node, and it outputs a signal to the node A, B, C, or D. According to the description above, whether or not the input plug is for the complementary signal depends on the circuit design, and its basic design principle still remains the same.

Figure 16:
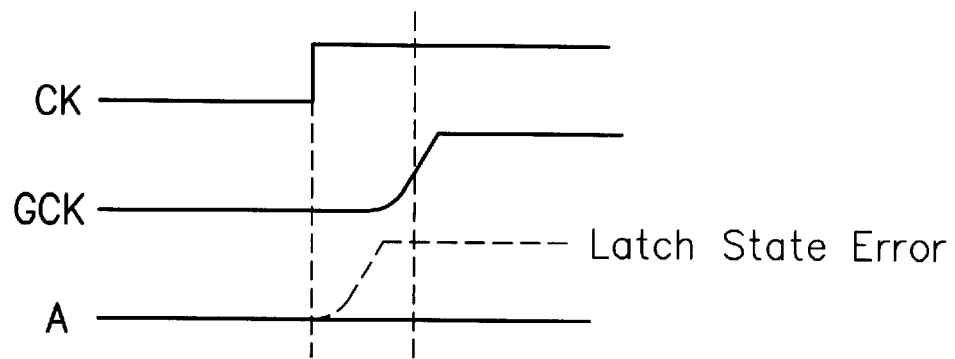
FIG. 16 shows the problem that may occur on the feedback loop when the clock gate circuit overloads according to this invention.

According to the description of the feedback functional circuit above, the problems of the slow system frequency and the floating phenomena are solved. However, if the clock gate signal GCK overloads, the feedback circuit will produce the racing phenomena. The racing phenomenon is shown in the graph of FIG. 16. On the signal of node A, for example, the clock gate signal GCK is overloaded, then the rising time is increased. , An error state is caused on node A When the clock gate signal GCK is fed back to the node A, as shown by the dotted line on the graph.

Figure 17:
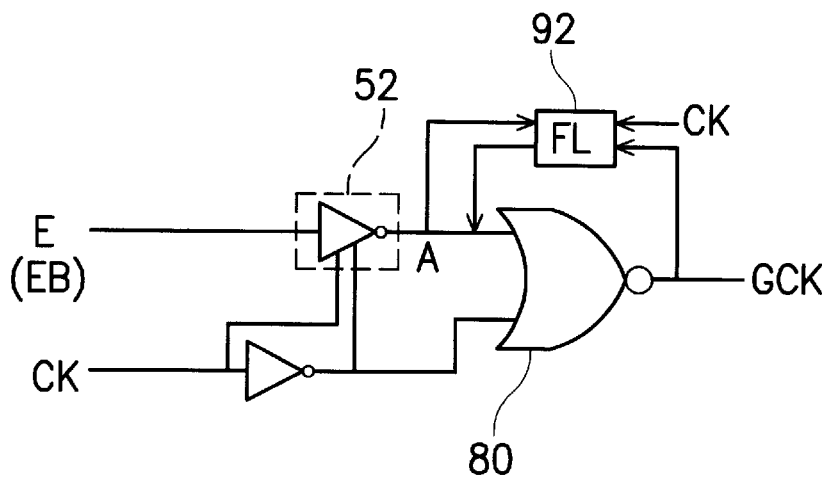
FIG. 17 shows the first type of clock gate circuit of the feedback functional circuit that solves the problem shown in the FIG. 16 according to this invention.

For a further method for solving the problem of the racing phenomena, the feedback functional circuit can be replaced with a performance of a special logic table of the circuit. FIG. 17 illustrates the structure for solving the problem in FIG. 16, according to the first embodiment of the feedback functional circuit 92 of the circuit of the clock gate, including a circuit that executes the performance logic table as shown below:

| The Clock | The Clock Gate Signal | Node A | Output |
| --- | --- | --- | --- |
| 0 | 0 | 0 | Z (High resistance) |
| 0 | 0 | 1 | Z |
| 1 | 0 | 0 | Z (Temporary) |
| 1 | 0 | 1 | 1 |
| 1 | 1 | 0 | 0 | wherein, Z is a high resistance output.

Figure 18:
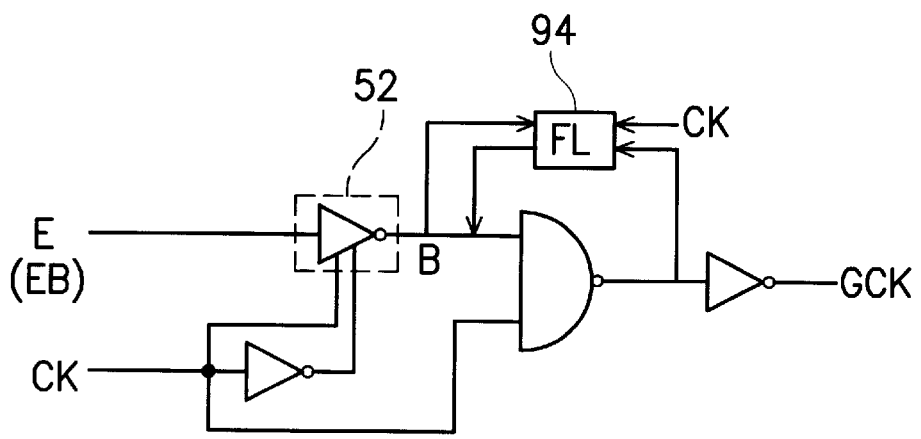
FIG. 18 shows the second type of clock gate circuit of the feedback functional circuit that solves the problem shown in FIG. 16 according to this invention.

FIG. 18 shows solution for the problem in FIG. 16, according to the second embodiment of the feedback circuit 94 of the circuit of the clock gate, including a circuit that caries out the performance logical table as shown below:

| The Clock | The Complementary Clock Gate Signal | Node B | Output |
| --- | --- | --- | --- |
| 0 | 1 | 0 | Z |
| 0 | 1 | 1 | Z |
| 1 | 0 | 1 | 1 |
| 1 | 1 | 0 | 0 |
| 1 | 1 | 1 | Z (Temporary) | wherein, Z is a high resistance output.

Figure 19:
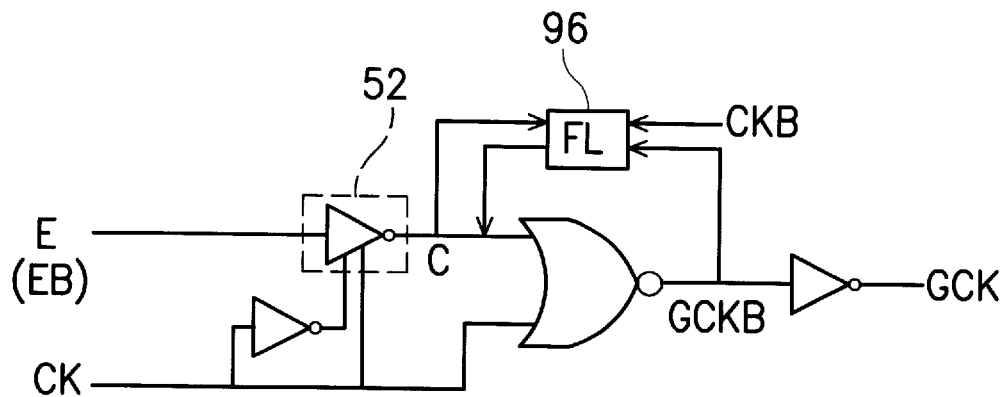
FIG. 19 shows the third type of clock gate circuit of the feedback functional circuit that solves the problem shown in FIG. 16 according to this invention.

FIG. 19 shows the solution for the problem in FIG. 16 according to the third embodiment of the feedback circuit 96 of the circuit of the clock gate, including a circuit that executes the performance logic table as shown below:

| The Clock | The Clock Gate Signal | Node C | Output |
| --- | --- | --- | --- |
| 0 | 0 | 0 | Z |
| 0 | 0 | 1 | Z |
| 1 | 0 | 0 | Z (Temporary) |
| 1 | 1 | 0 | 0 |
| 1 | 0 | 1 | 1 | wherein, Z is a high resistance output.

Figure 20:
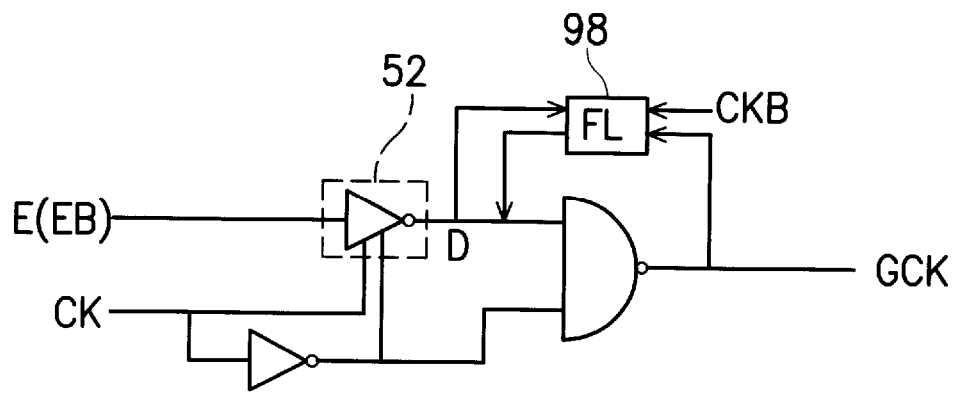
FIG. 20 shows the fourth clock gate circuit of the feedback functional circuit that solves the problem shown in FIG. 16 according to this invention.

FIG. 20 shows solution for the problem in FIG. 16 according to the fourth embodiment of the feedback circuit 98 of the clock gate circuit, including a circuit that executes the performance logic table as shown below:

| The Clock | The Clock Gate Signal | Node D | Output |
| --- | --- | --- | --- |
| 0 | 1 | 0 | Z |
| 0 | 1 | 1 | Z (Temporary) |
| 1 | 1 | 1 | Z |
| 1 | 1 | 0 | 0 |
| 1 | 0 | 1 | 1 | wherein, Z is a high resistance output.

Figure 21:
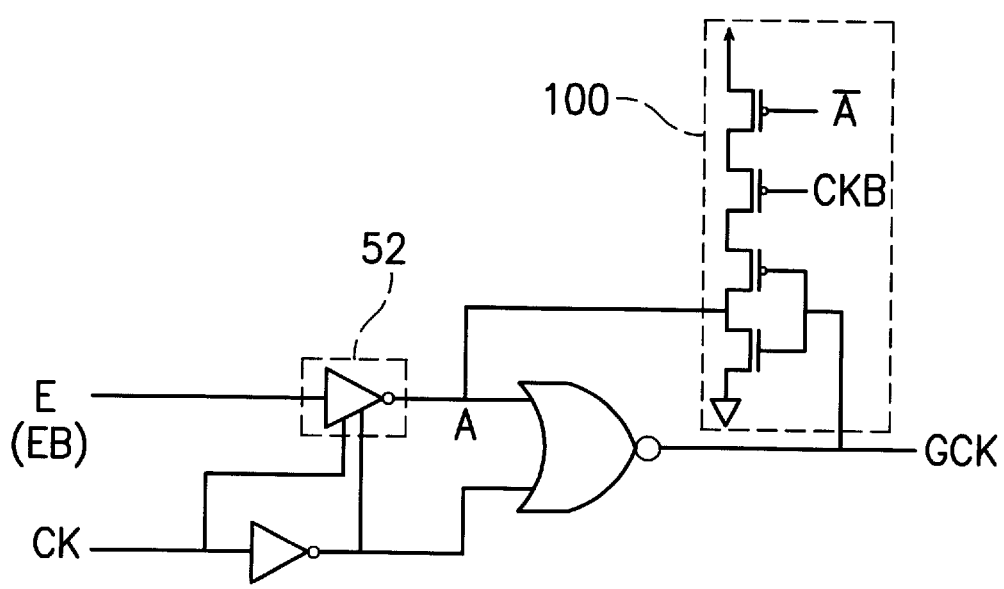
FIG. 21 is an example of the feedback functional circuit in FIG. 17.

The feedback functional circuit described above also can be made by the design described below. FIG. 21 shows embodiments of the feedback functional gate circuit in FIG. 17. In FIG. 21, the feedback functional gate circuit 100 is made up of three PMOS transistors and a NMOS transistor, and all transistors are connected together in series. The gate of the first PMOS transistor receives a complementary state of the node A, and the gate of the second PMOS transistor receives the complementary clock signal CKB. Two gates of the third PMOS transistor and the NMOS transistor receive the clock gate signal GCK, and their connect node is fed back to the node A. The feedback functional gate circuit 100 executes the logic table as shown below:

| The Complementary Clock | The Clock Gate Signal | The Complementary Node A | Output |
|---|---|---|---|
| 1 | 0 | 1 | Z |
| 1 | 0 | 0 | Z |
| 0 | 0 | 1 | Z (Temporary) |
| 0 | 0 | 0 | 1 |
| 0 | 1 | 1 | 0 | wherein, Z is a high resistance output.

Figure 22:
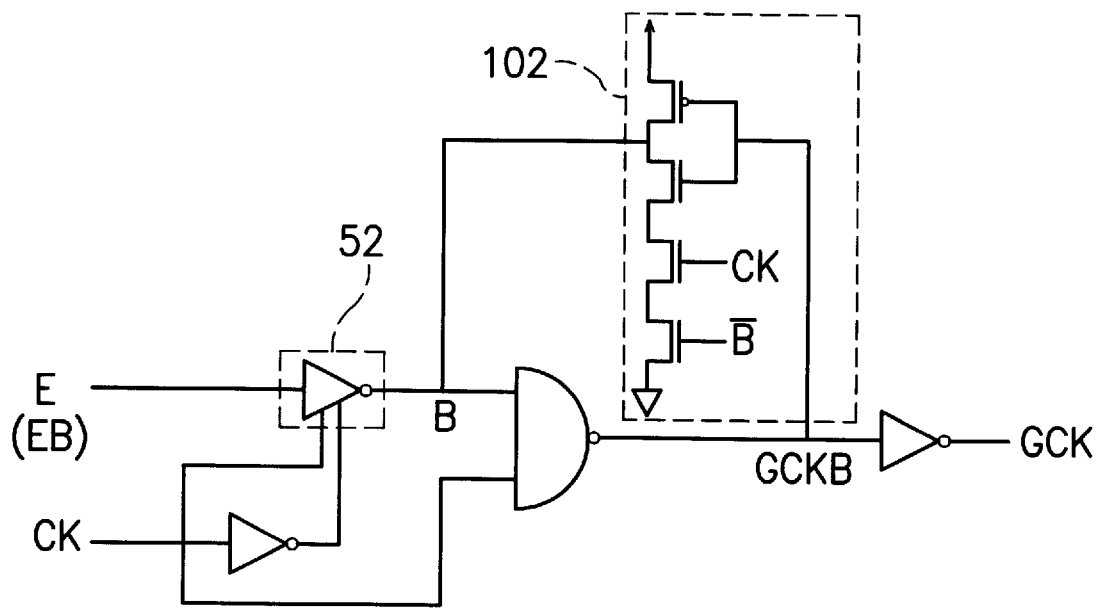
FIG. 22 is an example of the feedback functional circuit in FIG. 18.

FIG. 22 shows embodiments of the feedback functional gate circuit in FIG. 18. In FIG. 22, the feedback functional gate circuit 102 is made up of a PMOS transistor and three NMOS transistors, and all transistors are connected together in series. The gate of the third NMOS transistor receives a complementary state of the node B, and the gate of the second NMOS transistor receives the clock signal CK. Two gates of the first NMOS transistor and the PMOS transistor receive the complementary clock gate signal GCKB, and their connect node is fed back to the node B. The feedback functional gate circuit 102 executes the logic table as shown below:

| The Clock | The Complementary Clock Gate Signal | The Complementary Node B | Output |
|---|---|---|---|
| 0 | 1 | 1 | Z |
| 0 | 1 | 0 | Z |
| 1 | 0 | 0 | 1 |
| 1 | 1 | 1 | 0 |
| 1 | 1 | 0 | Z(Temporary) | wherein, Z is a high resistance output.

Figure 23:
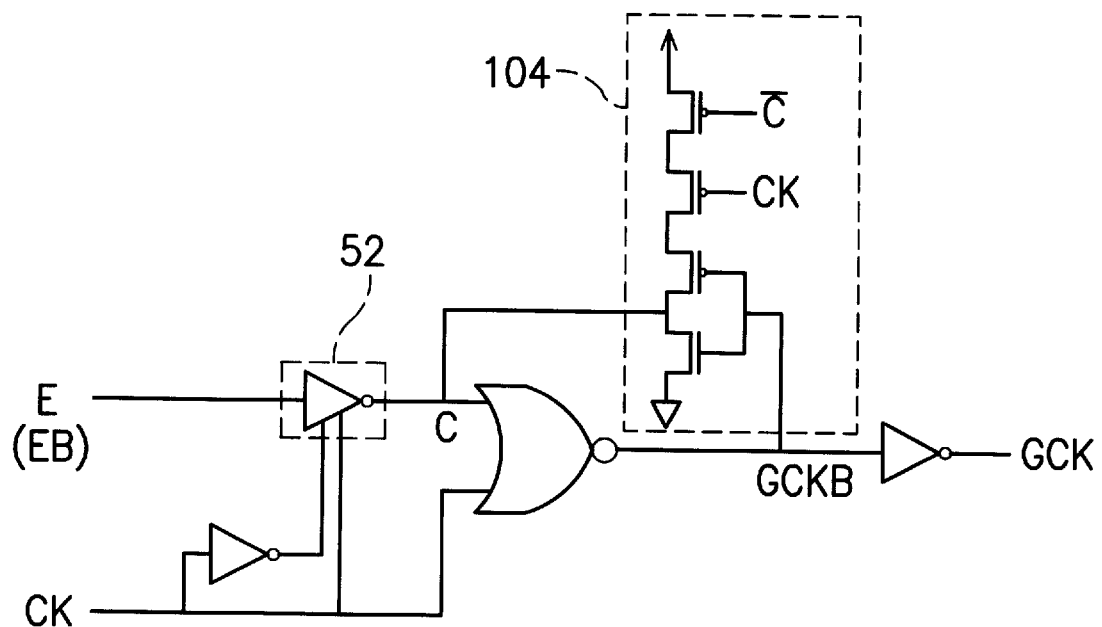
FIG. 23 is an example of the feedback functional circuit in FIG. 19.

FIG. 23 shows embodiments of the feedback functional gate circuit in FIG. 19. In FIG. 23, the feedback functional gate circuit 104 is made up of three PMOS transistors and a NMOS transistor, and all transistors are connected together in series. The gate of the first PMOS transistor receives a complementary state of the node C, and the gate of the second PMOS transistor receives the clock signal CK. Two gates of the third PMOS transistor and the NMOS transistor receive the complementary clock gate signal GCKB, and their connect node is fed back to the node C. The feedback functional gate circuit 104 executes the logic table as shown below:

| The Clock | The Complementary Clock Gate Signal | The Complementary Node C | Output |
|---|---|---|---|
| 1 | 0 | 1 | Z |
| 1 | 0 | 0 | Z |
| 0 | 0 | 1 | Z (Temporary) |
| 0 | 1 | 1 | 0 |
| 0 | 0 | 0 | 1 | wherein, Z is a high resistance output.

Figure 24:
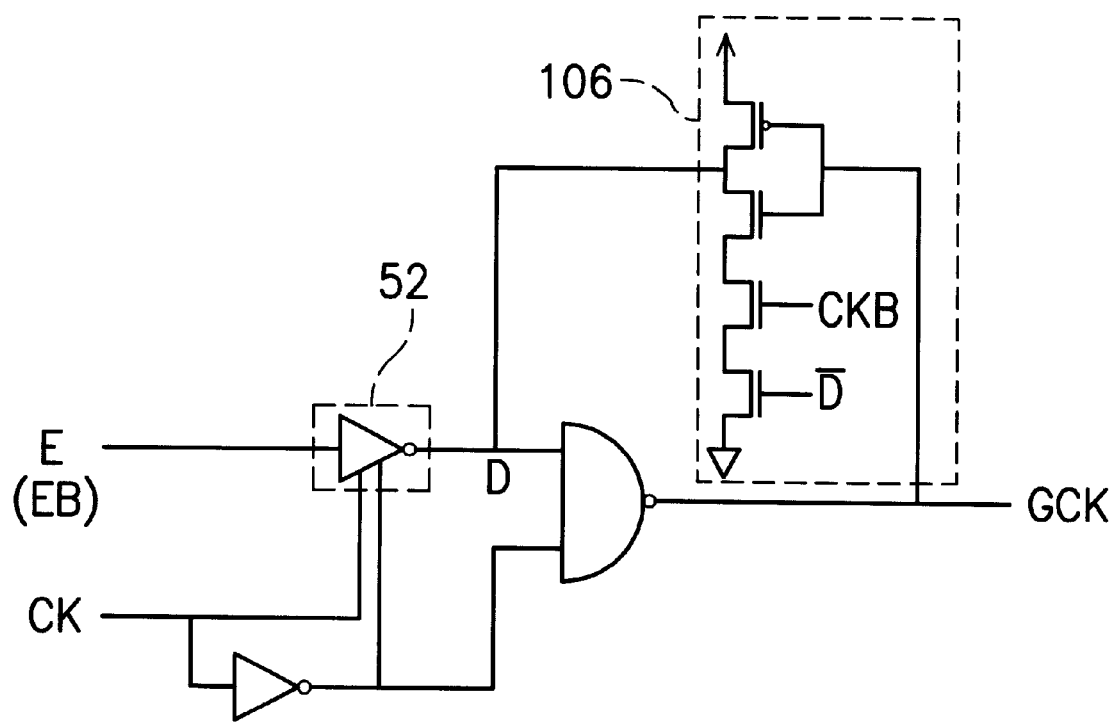
FIG. 24 is an example of the feedback functional circuit in FIG. 20.

FIG. 24 shows embodiments of the feedback functional gate circuit in FIG. 20. In FIG. 24, the feedback functional gate circuit 106 is made up of a PMOS transistor and three NMOS transistors, and all transistors are connected together in series. The gate of the third NMOS transistor receives a complementary state of the node D, and the gate of the second NMOS transistor receives the complementary clock signal CKB. Two gates of the first NMOS transistor and the PMOS transistor receive the clock gate signal GCK, and their connect node is fed back to the node D. The feedback functional gate circuit 106 executes the logic table as shown below:

| The Complementary Clock | The Clock Gate Signal | The Complementary Node D | Output |
|---|---|---|---|
| 0 | 1 | 1 | Z |
| 0 | 1 | 0 | Z |
| 1 | 1 | 0 | Z (Temporary) |
| 1 | 1 | 1 | 0 |
| 1 | 0 | 0 | 1 | wherein, Z is a high resistance output.

This invention provides a clock gate circuit that is a clock gate buffering circuit. In fact, the clock gate circuit also can work with an inverter, and it is connected in the last part to achieve a clock gate inverter.

According to the characteristics of this invention described above, the main characteristic is utilizing a tristate buffer, plus two input logic gates to make a clock gate circuit. Therefore, the clock gate circuit is a signal circuit without the latch. There are several advantages in this invention, including simplifying the circuit, reducing the size of circuit, reducing the consumption of power, reducing the transition time between the clock signal and the clock gate signal, reducing the clock skew, reducing the setup time between the enable signal and the clock signal, and simplifying the management of the power.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock gate buffering circuit, comprising:
    a functional circuit without a latch, wherein the functional circuit receives a clock and an enable signal and exports a clock gate signal, when the clock is at a rising edge, the clock gate signal with a logic voltage level is exported according to a logic level of the enable signal, and when the clock is at a falling edge, the clock gate signal with a fixed logic low level is exported
    wherein the functional circuit performs a function such that:
    when the clock is rising, the clock gate signal has a logic state that is similar to a logic state of the enable signal, wherein the enable signal is either a logical high or a logical low, and the functional circuit comprises:
        a first inverter receives the clock signal and sends a first signal;
        a first functional gate circuit receives the enable signal and the first signal, and sends a second signal; and
        a NOR gate receives the first and second signals, and sends to the clock gate signal;
    wherein the clock gate buffering circuit further comprises a second functional gate circuit, that feeds back from the clock gate signal to the output of the first functional gate circuit, such that when the first functional gate circuit has a floating phenomenon, and the second functional gate circuit prevents the clock gate signal from also floating.

2. The circuit claimed as claim 1, wherein the first functional gate circuit comprises a transistor gate that receives the enable signal, the clock signal and a complementary clock signal, and then sends the second signal.

3. The circuit claimed as claim 1, wherein the first functional gate circuit comprises a first and a second PMOS transistor and a first and a second NMOS transistor, all transistors are connected together in series; wherein two gates of the first PMOS transistor and the second NMOS transistor receive the enable signal, and two gates of the second PMOS transistor and the first NMOS transistor receive the clock and complementary clock signal respectively, and a connecting node, between the second PMOS transistor and the first NMOS transistor, is an output node and sends the second signal.

4. The circuit claimed as claim 1, wherein the second functional gate circuit comprises a series of a transitional gate and a second inverter, wherein the second inverter receives a signal from the clock gate, the transitional gate receives an output from the second inverter, and sends a feedback signal to the connecting node on the output of the first functional gate circuit.

5. The circuit claimed as claim 1, wherein the second functional gate circuit further comprises a first and a second PMOS transistor, and a first and a second NMOS transistor, all transistors are connected together in series, wherein two gates of the first PMOS transistor and the second NMOS transistor receive either the clock gate signal or a complementary signal of the clock gate signal; and two gates of the second PMOS transistor and the first NMOS transistor receive a complementary clock and the clock signal, and a connecting node between the second PMOS transistor and the first NMOS transistor sends a feedback signal to the output of the first functional gate circuit.

6. The circuit claimed as claim 1, wherein the clock gate buffering circuit further comprises a second functional gate circuit that receives the output of the first functional gate circuit, and the clock gate signal is fed back to the output of the first functional gate circuit; the second gate circuit provides a logic circuit that executes a logic table as below:

| The Clock | The Clock Gate Signal | The output of the first functional gate circuit | Output |
|---|---|---|---|
| 0 | 0 | 0 | Z |
| 0 | 0 | 1 | Z |
| 1 | 0 | 0 | Z |
| 1 | 0 | 1 | 1 |
| 1 | 1 | 0 | 0 | wherein Z is a high resistance, the clock and the output of the first functional gate circuit is a complementary state.

7. A clock gate buffering circuit, comprising:
a functional circuit without a latch, wherein the functional circuit receives a clock and an enable signal and exports a clock gate signal, when the clock is at a rising edge, the clock gate signal with a logic voltage level is exported according to a logic level of the enable signal, and when the clock is at a falling edge, the clock gate signal with a fixed logic low level is exported,
wherein the functional circuit performs a function such that:

when the clock is rising, a logic state of the clock gate signal is inverse to a logic state of the enable signal, wherein the enable signal is either a logical high or a logical low, and wherein the functional circuit comprises:
a first inverter receives the clock signal and sends a first signal;
a first functional gate circuit receives the enable signal and the first signal, and sends a second signal; and
an NOR gate receives the second signal and the clock signal, and sends the clock gate signal, and the clock gate buffering circuit further comprises a second and a third inverter that connect in series on an output plug of the OR gate; and includes a second functional gate circuit, wherein the second functional gate circuit has a complementary clock gate signal in between the second and the third inverters, return to the output of the first functional gate circuit, and when the first functional gate circuit has a floating phenomena, the second functional gate circuit prevents the clock gate signal from also floating.

8. The circuit claimed as claim 7, wherein the first functional gate circuit further comprises a transitional gate that receives the enable signal, the clock signal and a complementary clock signal, and sends to the second signal.

9. The circuit claimed as claim 7, wherein the first functional gate circuit further comprises a first and a second PMOS transistor and a first and a second NMOS transistor, all transistors are connected together in series; wherein two gates of the first PMOS transistor and the second NMOS transistor receive the enable signal together, and two gates of the second PMOS transistor and the first NMOS transistor receive a part of the clock and a part of a complementary clock, and a connect node in between the second PMOS transistor and the first NMOS transistor is an output node that sends the second signal.

10. The circuit claimed as claim 7, wherein the second functional gate comprises a transistor gate and a fourth inverter in series, wherein the fourth inverter receives the clock gate signal, the transistor gate receives an output of a fourth inverter, and sends a complementary signal to the output of the first functional gate circuit.

11. The circuit claimed as claim 7, wherein the second functional gate comprises a first and a second PMOS transistor and a first and a second NMOS transistor, all transistors are connected together in series; wherein two gates of the first PMOS transistor and the second NMOS transistor receive either the clock gate signal or the clock gate signal of a complementary signal, and two gates of the second PMOS transistor and the first NMOS transistor receive a complementary clock and the clock signal, and the connecting node in between the second PMOS transistor and the first NMOS transistor sends a feedback signal to the output of the first functional gate circuit.

12. The circuit claimed as claim 7, wherein the clock gate buffering circuit further comprises a second inverter and a third inverter that are connected together in series on an output plug of an AND gate; and a second functional gate circuit that receives the output of the first functional gate circuit, and the second inverter of a complementary clock gate signal feeds back to the output of the first functional gate circuit, the second functional gate circuit provides a logical circuit, executing a logic table as below:

| The Clock | The Complementary Clock Gate Signal | The output of the first functional gate circuit | Output |
|---|---|---|---|
| 0 | 1 | 0 | Z |
| 0 | 1 | 1 | Z |
| 1 | 0 | 1 | 1 |
| 1 | 1 | 0 | 0 |
| 1 | 1 | 1 | Z | wherein Z is a high resistance output, and the output of the first functional gate circuit is the complementary state.

13. A clock gate buffering circuit, comprising:
a functional circuit without a latch, wherein the functional circuit can receive a clock and an enable signal and export a clock gate signal, and when the clock is at a falling edge, the clock gate signal with a logic voltage level is exported according to a logic level of the enable signal, and when the clock is at a rising edge, the clock gate signal with a fixed logic high level is exported
wherein the functional circuit performs a function such that:
when the clock is falling, the clock gate signal has a logic state that is different from a logic state of the enable signal, wherein the enable signal is either a logical high or a logical low, and
wherein the functional circuit, comprises:
a first functional gate circuit that receives the enable signal and the clock, and sends a first signal ; and
an OR gate that receives the first signal and the clock, and sends the clock gate signal, and
wherein the clock gate buffering circuit further comprises a first inverter and a second inverter that connect in series with the OR gate in a last part of the circuit, and a second functional gate circuit, wherein the second functional gate circuit is in between the first inverter and the second inverter of a complementary clock gate signal, feeds back to the output of the first functional gate circuit, and when the first functional gate circuit has a floating phenomena, the second functional gate circuit prevents the clock gate signal from also floating.

14. The circuit claimed as claim 13, wherein the first functional gate circuit comprises a transitional gate that receives the enable signal, the clock and a complementary clock signal and then sends the first signal.

15. The circuit claimed as claim 13, wherein the first functional gate circuit comprises a first and a second PMOS transistor and a first and a second NMOS transistor, all transistors are connected together in series; wherein two gates of the first PMOS transistor and a second NMOS transistor are connected together and receive the enable signal, and two gates of the second PMOS transistor and the first NMOS receive a part of a complementary clock and a part of a clock signal, and a connecting node of the second PMOS transistor and the first NMOS transistor sends the first signal.

16. The circuit claimed as claim 13, wherein the second functional gate circuit comprises a transitional gate and a third inverter that connect in series, wherein the third inverter receives the complementary clock gate signal and the transitional gate receives the output of the third inverter, and sends a feedback signal to the output of the first functional gate circuit.

17. The circuit claimed as claim 13, wherein the second functional gate circuit comprises a first and a second PMOS transistor and a first and a second NMOS transistor, all transistors are connected in series together; wherein two gates of the first PMOS transistor and the second NMOS transistor are connected together and receive either the clock gate signal or the complementary clock gate signal, and two gates of the second PMOS transistor and the first NMOS transistor receive the clock and a complementary clock signal, and the second PMOS transistor and the first NMOS transistor of the connecting node send a feedback signal to the output of the functional gate circuit.

18. The circuit claimed as the claim 13, wherein the clock gate buffering circuit further comprises a first and a second inverter that are connected together in series with an output plug of the OR gate; and a second functional gate circuit, wherein the second functional gate circuit receives the output of the first functional gate circuit; and a complementary clock gate signal in between the first inverter and the second inverter feeds back to the output of the first functional gate circuit, the second functional gate circuit; includes a logic circuit that executes a logic table as below:

| The Complementary Clock | The Complementary Clock Gate Signal | The output of the first functional gate circuit | Output |
|---|---|---|---|
| 0 | 0 | 0 | Z |
| 0 | 0 | 1 | Z |
| 1 | 0 | 0 | Z |
| 1 | 1 | 0 | 0 |
| 1 | 0 | 1 | 1 | wherein Z is a high resistance output, and complementary clock and the output of the first functional gate cirsuit is a complementary state.

19. A clock gate buffering circuit, comprising,
a functional circuit without a latch, wherein the functional circuit can receive a clock and an enable signal and export a clock gate signal, and when the clock is at a falling edge, the clock gate signal with a logic voltage level is exported according to a logic level of the enable signal, and when the clock is at a rising edge, the clock gate signal with a fixed logic high level is exported, and
wherein the functional circuit performs a function such that
when the clock is a rising edge, the clock gate signal has a logic state and similar to a logic state of the enable signal, wherein the enable signal can be either a logical high or a logical low,
wherein the functional circuit comprises:
a first functional gate circuit that receives the enable signal and the clock, and sends a first signal;
a first inverter that receives the clock and sends a second signal; and
a NAND gate that receives the first signal and second signal, and sends the clock gate signal, and
wherein the clock gate buffering circuit further comprises a second functional gate circuit, wherein the output of the clock gate signal of the NAND gate feeds back to the output of the first functional gate circuit; and when the first functional gate circuit is under a floating phenomenon, the second functional gate circuit prevents the clock gate signal from also floating.

20. The circuit claimed as claim 19, wherein the first functional gate circuit comprises a transitional gate that receives the enable signal, the clock and a complementary clock signal, and sends the first signal.

21. The circuit claimed as claim 19, wherein the first functional gate circuit comprises a first and a second PMOS transistor and a first and a second NMOS transistor, all transistors are connected together in series; and wherein two gates of the first PMOS transistor and the second NMOS transistor and the second NMOS transistor receive the enable signal together, and two gates of the second PMOS transistor and the first NMOS transistor receive a complementary clock and the clock signal separately; and a connecting node of the second PMOS transistor and the first NMOS transistor sends the first signal.

22. The circuit claimed as claim 19, wherein the second functional gate circuit comprises a transitional gate and a second inverter that connect in series, wherein the second inverter receives the clock gate signal, the transitional gate receives the output of the second inverter, and sends a feedback signal to the output of the first functional gate circuit.

23. The circuit claimed as claim 19, wherein the second functional gate circuit comprises a first and a second PMOS transistor and a first and a second NMOS transistor, all transistors are connected in order in series; and wherein two gates of the first PMOS transistor and the second NMOS transistor are connected together and receive either the clock gate signal or the clock gate signal of a complementary signal; and two gates of the second PMOS transistor and the first NMOS transistor receive the clock and a complementary clock signal, and the second PMOS transistor and the first NMOS transistor of the connecting node send a feedback signal to the output of the first functional gate circuit.

24. The circuit claimed as claim 19, wherein the clock gate buffering circuit further comprises a second functional gate circuit, wherein the second functional gate circuit receives the output of the first functional gate circuit, the clock gate signal of the NAND gate, and feeds back to the output of the first functional gate circuit; and wherein the second functional gate circuit comprises a logic circuit that executes a logic table as below:

| The Complementary Clock | The Clock Gate Signal | The output of the first functional gate circuit | Output |
|---|---|---|---|
| 0 | 1 | 0 | Z |
| 0 | 1 | 1 | Z |
| 1 | 1 | 1 | z |
| 1 | 1 | 0 | 0 |
| 1 | 0 | 1 | 1 | wherein Z is a high resistance output, and the output of the first functional gate circuit is the complementary state.

* * * * *